US009520665B2

(12) United States Patent
Takeuchi et al.

(10) Patent No.: US 9,520,665 B2
(45) Date of Patent: Dec. 13, 2016

(54) ELECTRICALLY CONNECTING STRUCTURE, GLASS PLATE WITH TERMINAL HAVING THE SAME, AND METHOD OF MANUFACTURING GLASS PLATE WITH TERMINAL

(71) Applicant: ASAHI GLASS COMPANY, LIMITED, Tokyo (JP)

(72) Inventors: Shoichi Takeuchi, Tokyo (JP); Fumitaka Terashima, Tokyo (JP); Naohito Toriumi, Tokyo (JP); Eiji Saita, Tokyo (JP)

(73) Assignee: ASAHI GLASS COMPANY, LIMITED, Tokyo (JP)

( * ) Notice: Subject to any disclaimer, the term of this patent is extended or adjusted under 35 U.S.C. 154(b) by 115 days.

(21) Appl. No.: 14/613,867

(22) Filed: Feb. 4, 2015

(65) Prior Publication Data

US 2015/0155646 A1    Jun. 4, 2015

Related U.S. Application Data

(63) Continuation of application No. PCT/JP2013/071530, filed on Aug. 8, 2013.

(30) Foreign Application Priority Data

Aug. 10, 2012 (JP) ................................. 2012-178993

(51) Int. Cl.
*H01R 13/24* (2006.01)
*H01R 4/04* (2006.01)
(Continued)

(52) U.S. Cl.
CPC ............ *H01R 13/2414* (2013.01); *H01R 4/04* (2013.01); *H01R 43/007* (2013.01); *H01R 12/57* (2013.01); *H01R 13/04* (2013.01); *H01R 2201/26* (2013.01)

(58) Field of Classification Search
CPC ......... H01R 13/2414; H01R 4/48; H01R 4/04; B23K 1/0008; B32B 37/00
See application file for complete search history.

(56) References Cited

U.S. PATENT DOCUMENTS 3,616,122 A * 10/1971 Orcutt ............... B32B 17/10036
156/106
6,103,999 A * 8/2000 Nishio ................. H01Q 1/1278
219/203
(Continued)

FOREIGN PATENT DOCUMENTS

EP     1 566 860 A1    8/2005
EP     2 299 544 A1    3/2011
(Continued)

OTHER PUBLICATIONS

International Search Report dated Nov. 19, 2013 issued in International Application No. PCT/JP2013/071530.

*Primary Examiner* — Briggitte R Hammond
(74) *Attorney, Agent, or Firm* — Foley & Lardner LLP

(57) ABSTRACT

An electrically connecting structure includes a glass plate, a feeding part formed on the glass plate, a terminal having a base part opposing the glass plate, an adhesive adhering the glass plate and the terminal, and a conductive rubber arranged between the feeding part and the base part. The adhesive is a thermosetting adhesive that once softens when heated and thereafter cures, and is arranged to surround a periphery of the conductive rubber. The feeding part and the base part have electrical continuity via the conductive rubber.

14 Claims, 11 Drawing Sheets

(51) Int. Cl.
 *B32B 37/00* (2006.01)
 *H01R 43/00* (2006.01)
 *H01R 13/04* (2006.01)
 *H01R 12/57* (2011.01)

(56) References Cited

U.S. PATENT DOCUMENTS

| | | | |
|---|---|---|---|
| 6,307,515 | B1 | 10/2001 | Sauer et al. |
| 7,059,884 | B2 * | 6/2006 | Hisaeda ............... H01R 13/20 439/329 |
| 7,134,201 | B2 * | 11/2006 | Ackerman ......... H01R 43/0207 219/203 |
| 7,223,939 | B2 * | 5/2007 | Hoepfner ............... H05B 3/84 219/203 |
| 7,663,561 | B2 * | 2/2010 | Hisaeda ............ B32B 17/10036 343/713 |
| 2005/0112291 | A1 | 5/2005 | Okajima et al. |
| 2007/0029301 | A1 | 2/2007 | Tokiwa et al. |
| 2010/0285685 | A1 | 11/2010 | Ziegler et al. |
| 2011/0109115 | A1 | 5/2011 | Yamada et al. |
| 2011/0163569 | A1 * | 7/2011 | Yoneyama ........... H01R 12/515 296/146.1 |

FOREIGN PATENT DOCUMENTS

| | | |
|---|---|---|
| JP | 06-260533 A | 9/1994 |
| JP | 2007-018981 A | 1/2007 |
| JP | 2010-020918 A | 1/2010 |
| JP | 2010-539661 A | 12/2010 |
| JP | 2012-043690 A | 3/2012 |
| WO | WO-03/076239 A1 | 9/2003 |
| WO | WO-2012/066886 A1 | 5/2012 |

* cited by examiner

ELECTRICALLY CONNECTING STRUCTURE, GLASS PLATE WITH TERMINAL HAVING THE SAME, AND METHOD OF MANUFACTURING GLASS PLATE WITH TERMINAL

CROSS-REFERENCE TO RELATED APPLICATIONS

This application is a continuation application filed under 35 U.S.C. 111(a) claiming the benefit under 35 U.S.C. 120 and 365(c) of PCT International Application No. PCT/JP2013/071530 filed on Aug. 8, 2013, which is based upon and claims the benefit of priority of Japanese Patent Application No. 2012-178993 filed on Aug. 10, 2012, the entire contents of which are incorporated herein by reference.

BACKGROUND OF THE INVENTION

1. Field of the Invention

The present invention relates to an electrically connecting structure for a glass plate and a terminal, a glass plate with terminal having the same, and a method of manufacturing the glass plate with terminal.

2. Description of the Related Art

In a vehicle window glass, solder that includes lead is used to bond a terminal and a conductor formed on a surface of a glass plate. Recently, the use of solder that includes no lead is desired in order to reduce environmental load or the like. However, replacements for the lead in such solder, such as indium, tin, silver, or the like, are expensive, and not much advances have been made regarding the use of such solder. On the other hand, as a means of bonding the glass plate and the terminal by other than the solder that includes no lead, the use of a conductive adhesive, for example, has been proposed (refer to Japanese National Publication of International Patent Application No. 2010-539661 and Japanese Laid-Open Patent Publication No. 2010-20918, for example).

However, it is difficult to obtain a sufficient adhesion required by the vehicle window glass using the conductive adhesive. Even if a resin content of the conductive adhesive is increased in order to increase the adhesion, the conductivity decreases (resistance increases), and thus, it is difficult to simultaneously obtain sufficient adhesion and conductivity.

SUMMARY OF THE INVENTION

One object of the present invention is to provide an electrically connecting structure, a glass plate with terminal having the same, and a method of manufacturing the glass plate with terminal, which can obtain sufficient adhesion and conductivity without using solder.

Means of Solving the Problem

In order to achieve the above object, one embodiment provides an electrically connecting structure, and a glass plate with terminal having the same, including a glass plate, a feeding part formed on the glass plate, a terminal having a base part opposing the glass plate, an adhesive adhering the glass plate and the terminal, and a conductive rubber arranged between the feeding part and the base part, wherein the adhesive is a thermosetting adhesive that once softens when heated and thereafter cures, and is positioned at least on both sides of the conductive rubber, and the feeding part and the base part have electrical continuity via the conductive rubber.

In addition, in order to achieve the above object, one embodiment provides a method of manufacturing a glass plate with terminal, including a first step to position a conductive rubber between a feeding part of the glass plate and a base part of the terminal, and a second step to hold the conductive rubber in a compressed state, and to heat and cure an adhesive that bonds the glass plate and the terminal in a state in which the adhesive is compressed by applying pressure thereon, so that electrical continuity is secured between the feeding part and the base part via the conductive rubber.

DESCRIPTION OF THE PREFERRED EMBODIMENTS

Figure 1:
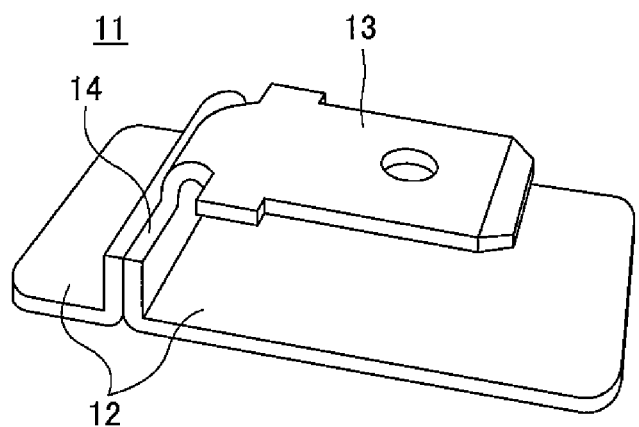
FIG. 1 is a perspective view illustrating an example of a terminal.

FIG. 1 is a perspective view of a terminal 11 used in one embodiment of the present invention. The terminal 11 is a cable terminal for a vehicle, to which a cable that is not illustrated, such as a wire harness of the vehicle, is connected. The terminal 11 is formed by a thin plate made of a conductive metal such as copper or the like, and is preferably tin-plated. The terminal 11 includes a base part 12, a male terminal part 13, and a support part 14.

The base part 12 is a metal member that has an elongated rectangular plate shape for mounting the terminal 11 on a glass plate that is not illustrated. The male terminal part 13 is a flat tab terminal to which the cable is to be connected, and is formed according to Japan Industrial Standards JIS D5403 PA (or may be PB), for example. The support part 14 is a member that projects from the base part 12, and supports a base of the male terminal part 13 in order to secure a predetermined distance between the base part 12 and the male terminal part 13.

Figure 2:
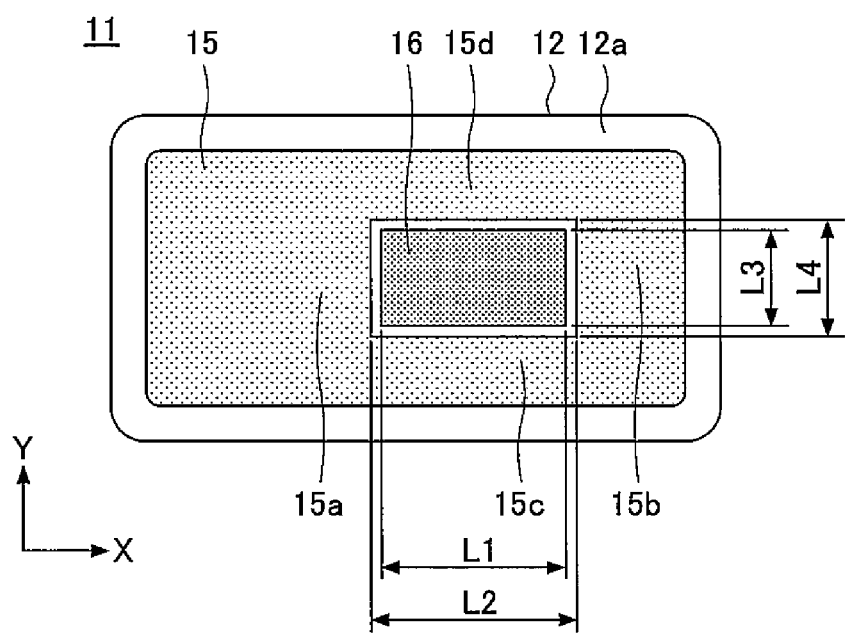
FIG. 2 is a bottom view of the terminal illustrated in FIG. 1.

FIG. 2 is a bottom view of the terminal 11 illustrated in FIG. 1. An elongated rectangular mounting surface 12a that is formed to be planar, is provided as a bonding surface with respect to the glass plate that is not illustrated, at a bottom surface of the plate-shaped base part 12. A non-conductive adhesive 15, and a conductive rubber 16 having a resistance that varies depending on a compressibility thereof are mounted on the mounting surface 12a in a planar manner. The terminal 11 is bonded to the surface of the glass plate in a state in which the adhesive 15 and the conductive rubber 16 are sandwiched between the surface of the glass plate and the mounting surface 12a in a normal direction to the base part 12. The bonding of the terminal 11 to the glass plate includes bonding of the terminal 11 to a feeding part (for example, a feeding part 22 of FIG. 6 to be described later) formed on the glass plate.

As illustrated in FIG. 2, the adhesive 15 is preferably adhered on the mounting surface 12a so as to be positioned at least on both sides of the conductive rubber 16. By adhering the adhesive 15 in this manner, it is possible to easily secure a sufficient adhesion between the terminal 11 and the glass plate, and to sandwich the conductive rubber 16 between the mounting surface 12a and the glass plate with a uniform load. By sandwiching the conductive rubber 16 with the uniform load, it is possible, for example, to prevent mounting dimensions of the terminal 11 with respect to the glass plate (parallelism of the male terminal part 13 and the glass plate, distance of the male terminal part 13 from the glass plate, or the like) from becoming inconsistent among individual products. In addition, because the conductive rubber 16 is uniformly compressed by being sandwiched with the uniform load, and the resistance of the conductive rubber 16 approaches a uniform distribution, it is possible, for example, to prevent the resistance of the conductive rubber 16 from becoming inconsistent among the individual products.

The adhesive 15 preferably includes a bonding surface along at least two opposing sides of the mounting surface 12a of the base part 12, so as to be positioned on both sides of the conductive rubber 16. In the case illustrated in FIG. 2, for example, the adhesive 15 includes bonding surfaces 15a, 15b, 15c, and 15d that are arranged along the sides of the mounting surface 12a to surround a periphery of the conductive rubber 16 from four sides, in order to effectively improve the adhesion and the uniformity of the load.

The adhesive 15 is preferably formed in an area of 35 mm² or greater from the viewpoint of obtaining stable adhesion, and is more preferably formed in an area of 140 mm² or greater. In addition, the adhesive 15 is preferably formed in an area of 1600 mm² or less from the viewpoint of unnecessarily increasing the side of the terminal 11. The adhesion of the adhesive is preferably 1 MPa or greater and 30 MPa or less in a normal direction to the surface, from the viewpoint of obtaining a suitable adhesion. The adhesion is more preferably 5 MPa or greater.

The adhesive 15 is not limited to the arrangement of FIG. 2, as long as the sufficient adhesion and conductivity can be secured, and may include a bonding surface in the periphery of the conductive rubber 16 so that a non-bonding surface is formed at least in a part of the entire periphery of the conductive rubber 16. For example, at least one of the bonding surfaces 15a, 15b, 15c, and 15d of the adhesive 15, arranged in the periphery of the conductive rubber 16, may include the non-bonding surface. In addition, the adhesive 15 may make contact with the periphery of the conductive rubber 16, or may include the bonding surface via a gap (non-bonding surface) without making contact with at least one side of the periphery of the conductive rubber 16. Moreover, the adhesive 15 preferably has adhesion at room temperature prior to being heated. Such adhesion of the adhesive 15 enables the terminal 11 to be temporarily provided on the glass plate, in order to facilitate the positioning.

The adhesive 15 is a thermosetting adhesive that once softens when heated and thereafter cures. The adhesive 15 heated from a state before bonding the glass plate and the terminal 11 preferably has properties such that a viscosity of the adhesive 15 is $6.0 \times 10^3$ Pa·s or less at a temperature of 70° C. or higher and lower than 120° C., and cures at a temperature of 120° C. or higher. It is particularly preferable that the viscosity of the adhesive 15 is $6.0 \times 10^3$ Pa·s or less at a temperature of 80° C. or higher and lower than 110° C. The viscosity of the adhesive 15 is more preferably $5.0 \times 10^3$ Pa·s or less at a temperature of 70° C. or higher and lower than 120° C. The curing temperature may be 130° C. or higher.

Figure 3:
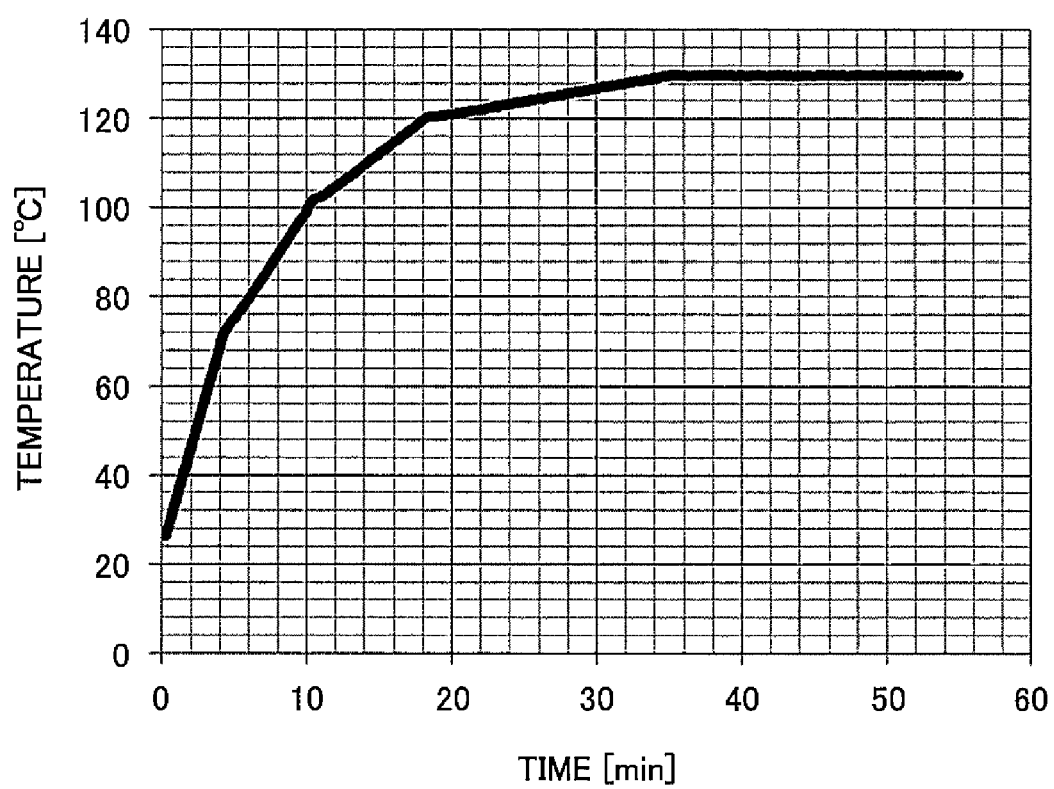
FIG. 3 is a graph illustrating a heat profile with respect to an adhesive.
Figure 4:
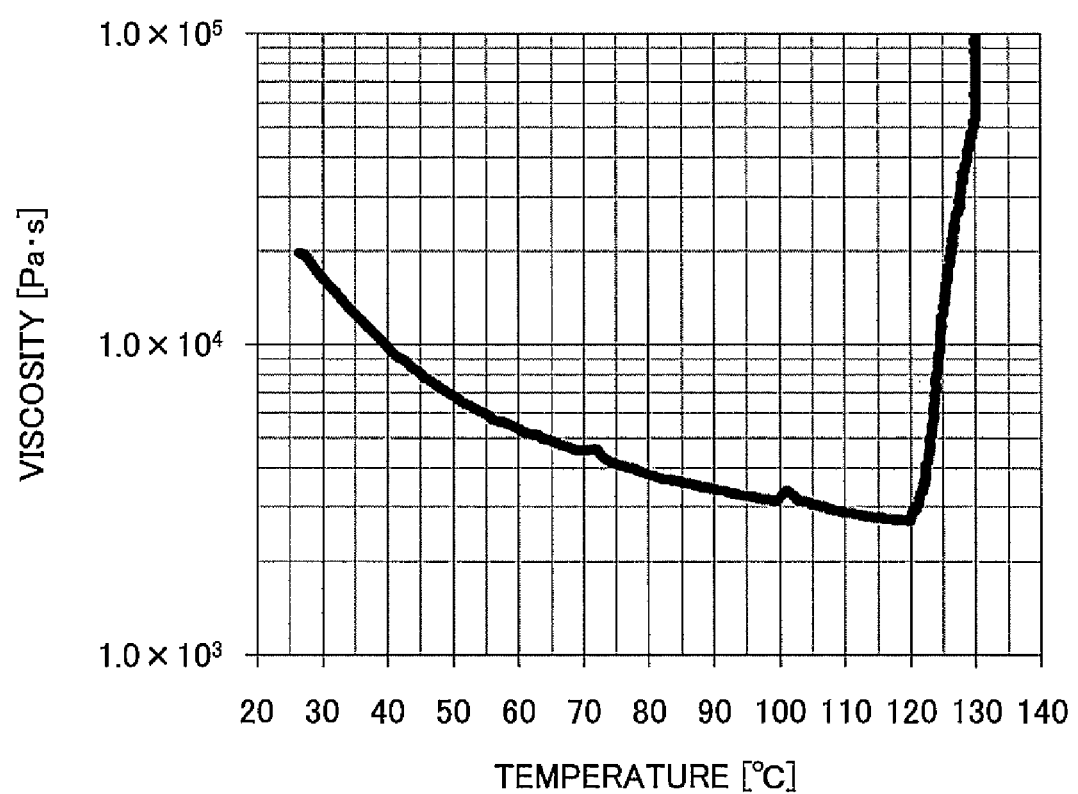
FIG. 4 is a graph illustrating a viscosity with respect to a heating temperature of the adhesive.
Figure 5:
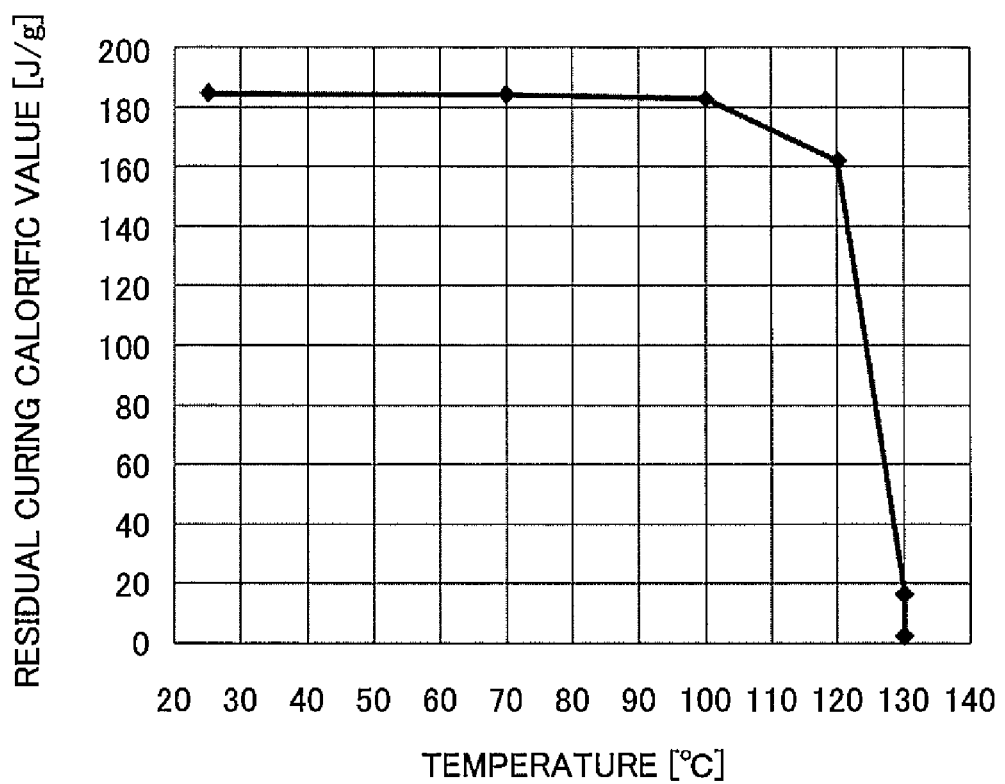
FIG. 5 is a graph illustrating a residual curing calorific value with respect to the heating temperature of the adhesive.

More particularly, viscosity properties of the adhesive 15, when given a temperature profile of FIG. 3, become as illustrated in FIG. 4. The adhesive 15 softens with the rise in the temperature from the room temperature caused by the heating, and cures when a predetermined temperature is exceeded. FIG. 5 illustrates a residual curing calorific value measured by DSC (Differential Scanning calorimetry) and having properties in which the curing rapidly progresses when the predetermined temperature (120° C. in FIG. 5) is exceeded.

By once softening the adhesive 15 by the heating, a thickness of the adhesive 15 can easily be compressed from the state before the bonding, by causing the adhesive 15 to make close contact with the terminal 11 and the glass plate and by applying pressure thereon. The adhesive can be cured in the compressed state by further heating to cause the curing.

The conductive rubber 16 is a plate-shaped rubber member that is arranged on the mounting surface 12a to be able to have electrical continuity with the base part 12 and be surrounded by the adhesive 15. For example, the conductive rubber 16 is formed to an elongated rectangular shape, and may be fixed on the mounting surface 12a by being sandwiched from at least both sides by the bonding surface of the adhesive 15. In this case, the adhesive 15 preferably has the viscosity from the viewpoint of sandwiching the conductive rubber 16 from at least both sides.

In a particular example in which the bonding surfaces 15a and 15b sandwich the conductive rubber 16 from both sides in an X-axis direction parallel to a longitudinal direction of the base part 12, a maximum outer dimension L1 of the conductive rubber 16 in the X-axis direction is preferably greater than or equal to an opposing distance L2 between the bonding surfaces 15a and 15b. In a case in which the maximum outer dimension L1 is greater than the opposing distance L2, the conductive rubber 16 sinks into the bonding surfaces 15a and 15b and the position thereof becomes fixed with respect to the mounting surface 12a. In addition, in a case in which bonding surfaces 15c and 15d sandwich the conductive rubber 16 from both sides in a Y-axis direction parallel to a short direction of the base part 12, a maximum outer dimension L3 of the conductive rubber 16 in the Y-axis direction is preferably greater than or equal to an opposing distance L4 between the bonding surfaces 15c and 15d. In a case in which the maximum outer dimension L3 is greater than the opposing distance L4, the conductive rubber 16 sinks into the bonding surfaces 15c and 15d and the position thereof becomes fixed with respect to the mounting surface 12a.

The conductive rubber 16 is not limited to the plate-shaped rubber member. The conductive rubber 16 may be a circular cylinder-shaped or convex-shaped rubber member, or an arrangement of a plurality of such members. In addition, the conductive rubber 16 is not limited to rubber, and may be made of any material having a resistance that decreases when compressed, such as an anisotropic conductive film or the like, for example.

<Configuration of Electrically Connecting Structure 1>

Figure 6:
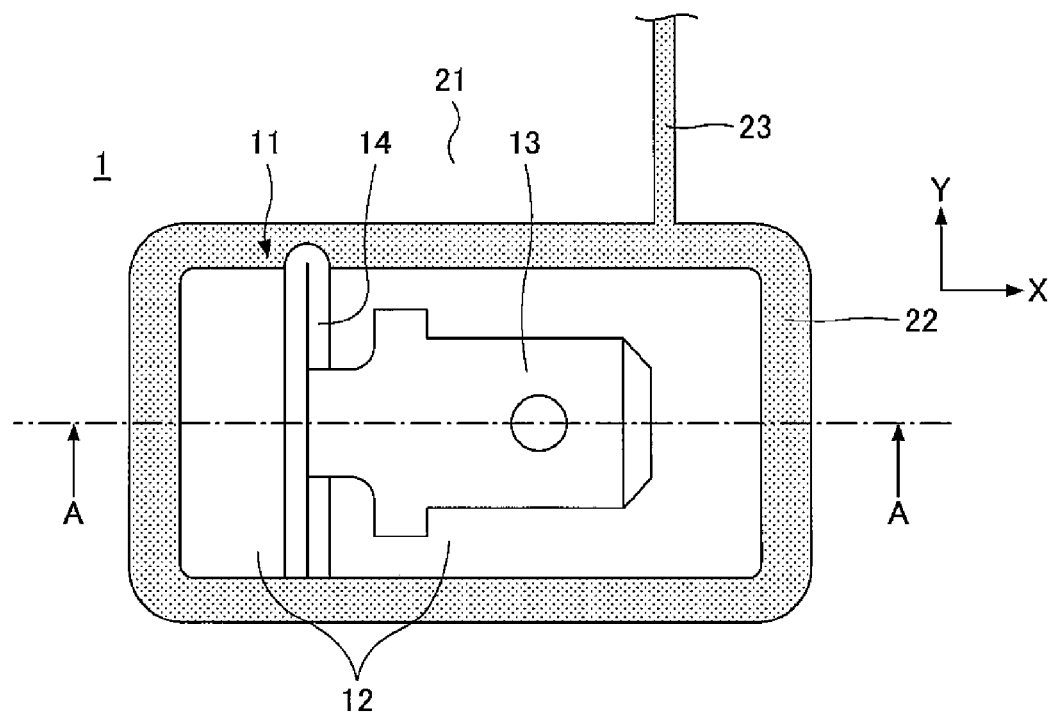
FIG. 6 is a schematic plan view of an electrically connecting structure for the terminal and a glass plate illustrated in FIG. 1.

FIG. 6 is a schematic plan view of an electrically connecting structure 1 in one embodiment of the present invention. The electrically connecting structure 1 is a bonded structure formed by the terminal 11 and a glass plate 21. The glass plate 21 is a vehicle window glass, for example. The terminal 11 is mounted on a flat conductive feeding part 22 that is formed on the surface of the glass plate 21. The feeding part 22 is a part for feeding to a line-shaped conductor 23 formed in a line shape on the surface of the glass plate 21, and may be connected to the line-shaped conductor 23 to be able to have electrical continuity therewith. The line-shaped conductor 23 is an antenna element, or a feeder line to the antenna element, for example. The line-shaped conductor 23 may be a heating wire for defrosting the glass plate 21. In addition, the feeding part 22 may be a feeder to a conductor layer formed on the glass plate 21, and may be a part for feeding to any conductor formed on the glass plate 21. For example, feeding may mean supplying power to the line-shaped conductor, and may also mean receiving power from the line-shaped conductor.

The feeding part 22 and the line-shaped conductor 23 may be formed by printing a paste including a conductive metal, such as a silver paste or the like, on the surface of the glass plate 21, and firing the printed paste. The method of forming the feeding part 22 and the line-shaped conductor 23 is not limited to such, and a line-shaped body or a film body made of a conductive material, such as copper or the like, may be formed on the surface of the glass plate 21, and these bodies may be adhered on the glass plate 21 by an adhesive or the like.

Figure 7:
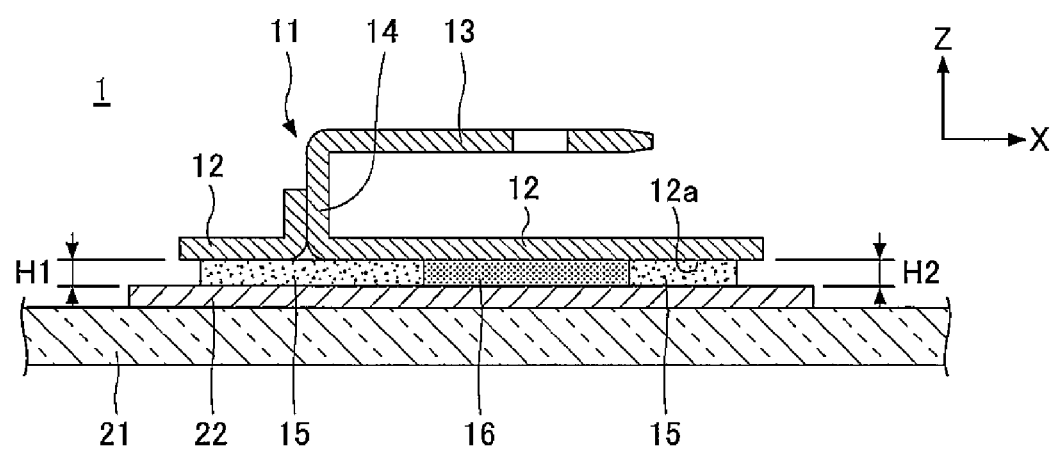
FIG. 7 is a cross sectional view along A-A in FIG. 6.

FIG. 7 is a cross sectional view of the electrically connecting structure 1 along A-A in FIG. 6. The electrically connecting structure 1 includes the glass plate 21, the terminal 11, the adhesive 15, and the conductive rubber 16. The terminal 11 includes the base part 12 having the mounting surface 12a that opposes the glass plate 21.

The adhesive 15 is arranged between the glass plate 21 and the base part 12, and bonds the glass plate 21 and the terminal 11. The adhesive 15 is not limited to being interposed between the feeding part 22 of the glass plate 21 and the mounting surface 12a of the base part 12, and may be interposed between a surface part of the glass plate 21 where no feeding part 22 is provided and the mounting surface 12a. The conductive rubber 16 is arranged between the feeding part 22 and the mounting surface 12a of the base part 12.

The adhesive 15 is a thermosetting adhesive that once softens when heated and thereafter cures. By using such a thermosetting adhesive, the thickness of the adhesive 15 can easily be compressed from the state before the bonding, by causing the adhesive 15 to make close contact with the terminal 11 and the glass plate 21 and by applying pressure thereon. The adhesive 15 can be cured in the compressed state by further heating to cause the curing. Because the adhesive 15 is compressed and cured in the state sandwiched between the glass plate 21 and the base part 12, the conductive rubber 16 can be maintained in the compressed state. A sufficient adhesion can be secured by compressing and curing the adhesive 15, and the resistance of the conductive rubber 16 can be decreased by compressing the conductive rubber 16 utilizing the compressing and curing of the adhesive 15, to thereby secure a sufficient conductivity between the feeding part 22 and the base part 12. By securing the conductivity between the feeding part 22 and the base part 12 via the conductive rubber 16, a cable that is not illustrated and electrically connects to the male terminal part 13 can be electrically connected to the feeding part 22 via the male terminal part 13 that electrically connects to the base part 12, for example.

In order to secure both the sufficient adhesion and conductivity, a thickness H1 of the adhesive 15 after the compressing and curing is preferably set to a dimension that is compressed by 20% to 30% (preferably 22% to 28%) with respect to an initial thickness before the compressing and curing, and a thickness H2 of the conductive rubber 16 after the compressing is preferably set to a dimension that is compressed with a compressibility (for example, 10% or higher) so that the resistance becomes 50 mΩ or lower. When time degradation is taken into consideration, the thickness H2 of the conductive rubber 16 after the compressing is preferably set to a dimension that is compressed with a compressibility (for example, 20% or higher) so that the resistance becomes 100 mΩ or lower. Of course, an upper limit of the compressibility needs to ensure normal functions of the conductive rubber 16.

The compressibility of the adhesive 15 or the conductive rubber 16 may be obtained from (1−thickness after compressing/initial thickness before compressing)×100(%).

In addition, the electrical continuity between the base part 12 and the male terminal part 13, and between the male terminal part 13 and the cable that is not illustrated, does not necessarily have to be a D.C. connection, and an indirect connection may be employed. For example, an electronic circuit, such as an amplifier or the like, may be interposed between these parts that are to have the electrical continuity.

<Method of Manufacturing Window Glass with Terminal 11>

Figure 8:
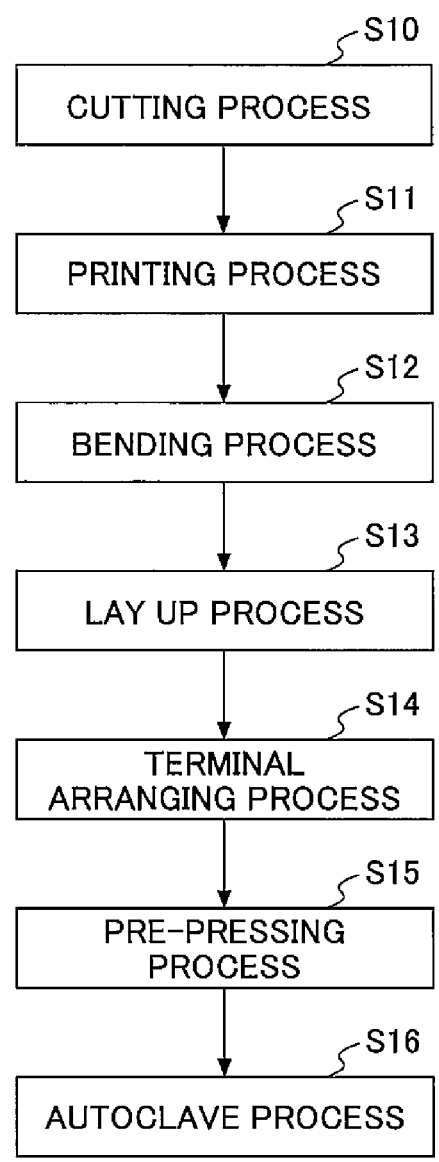
FIG. 8 illustrates an example of a method of manufacturing a window glass with the terminal.

FIG. 8 is a flow chart illustrating an example of a method of manufacturing the window glass with the terminal 11. In this example, a description will be given of the method of manufacturing laminated glass with terminal, for use as a vehicle windshield (front glass). In other words, a description will be given of a case in which the glass plate 21 described above is a laminated glass having a plurality of glass plates laminated via interlayer films.

The method of manufacturing the glass plate with the terminal illustrated in FIG. 8 includes a first step to position the conductive rubber 16 between the feeding part 22 of the glass plate 21 and the base part 12 of the terminal 11, and a second step to hold the conductive rubber 16 in a compressed state, and to heat and cure the adhesive 15 that bonds the glass plate 21 and the terminal 11 in a state in which the adhesive 15 is compressed by applying pressure thereon, so that electrical continuity is secured between the feeding part 22 and the base part 12 via the conductive rubber 16. Details of these steps will be described later, however, the first step corresponds to a terminal arranging process of step S14 illustrated in FIG. 8, and the second step corresponds to a pre-pressing process of step S15 and/or an autoclave process of step S16 illustrated in FIG. 8.

In a case in which the adhesive is a thermosetting adhesive that once softens and thereafter cures when heated, the second step may include a softening process that once softens the adhesive by heating, and a curing process that cures the adhesive in the compressed state by heating.

A cutting process of step S10 cuts the glass plates to be used for the laminated glass from a raw glass plate. The method of cutting is not limited to a particular method, however, the glass places may be cut, for example, by forming scribe lines in the shape of the windshield on the rectangular raw glass plate, and breaking along the scribe lines to cut out the glass plate. The periphery of the cut out glass plate is subjected to a grinding process. In the cutting process, the glass plate on the vehicle interior side and the glass plate on the vehicle exterior side (a pair of glass plates) are cut out.

In a printing process of step S11, a silver paste that becomes the feeding part is printed on the surface on the vehicle interior side of the glass plate on the vehicle interior side. The line-shaped conductor may be printed simultaneously, or a black ceramic paste that becomes a concealed layer may be formed on a peripheral edge of the glass plate before the feeding part is printed.

A bending process of step S12 bends the pair of glass plates subjected to the printing process, in a state in which a separating powder is interposed between the overlapping glass plate on the vehicle interior side and the glass plate on the vehicle exterior side, by a method such as gravity bending or the like. In the bending process, the pair of glass plates is bent in a state softened by heating in a furnace. The pair of glass plates is annealed after being bent into a predetermined shape. The bending process is not limited to the gravity bending, and may bend the pair of glass plates by pressing, or bend one glass plate at a time without overlapping the glass plates.

A lay up process of step S13 laminates an interlayer film between the pair of glass plates subjected to the bending process. The interlayer film is made of polyvinyl butyral, for example.

The terminal arranging process of step S14 arranges the terminal 11 illustrated in FIGS. 1, 2, 6, and 7 described above on the feeding part of one glass plate (for example, the glass plate on the vehicle interior side) of the pair of glass plates. In the case illustrated in FIG. 7, the terminal arranging process positions the conductive rubber 16 and the adhesive 15 between the feeding part 22 of the glass plate 21 and the base part 12 of the terminal 11.

In a case in which the conductive rubber 16 and the adhesive 15 are mounted in advance on the mounting surface 12a of the base part 12 as illustrated in FIG. 2, the terminal arranging process of step S14 illustrated in FIG. 8 arranges the base part 12 that is already mounted with the conductive rubber 16 and the adhesive 15 on the feeding part 22 of the glass plate 21.

However, the terminal arranging process of step S14 may arrange the base part 12 having the mounting surface 12a on which the adhesive 15 is already mounted, on the glass plate 21 having the feeding part 22 on which the conductive rubber 16 is already mounted. Alternatively, the terminal arranging process of step S14 may arrange the base part 12 having the mounting surface 12a on which the conductive rubber 16 is already mounted, on the glass plate 21 having the surface (may be the feeding part 22, or may be a part where no feeding part 22 is provided) already mounted with the adhesive 15. Alternatively, the terminal arranging process of step S14 may arrange the base part 12 on the glass plate 21 having the feeding part 22 already mounted with the conductive rubber 16 and the surface (may be the feeding part 22, or may be a part where no feeding part 22 is provided) already mounted with the adhesive 15.

The pre-pressing process of step S15 illustrated in FIG. 8 performs a de-airing process to deaerate the air between the pair of glass plates and the interlayer film, and performs a heating adhesion process to heat and adhere the pair of glass plates and the interlayer film. For example, a laminated body formed by the pair of glass plates and the interlayer film may be inserted into a rubber bag and subjected to decompression heating, in order to deaerate the air. In addition, the pre-pressing process may be performed using the nipper roll method or the rubber channel method.

The autoclave process of step S16 subjects the laminated body formed by the pair of glass plates and the interlayer film to a pressing process in an autoclave, in order to heat and bond the pair of glass plates and the interlayer film.

By performing the pre-pressing process and/or the autoclave process, the conductive rubber 16 is compressed between the base part 12 and the glass plate 21, together with the adhesive 15, in the case of the configuration illustrated in FIG. 7, for example. By curing the adhesive 15 in the compressed state, a state in which the base part 12 and the glass plate 21 are mutually attracted can be maintained, and the conductive rubber 16 that is arranged between the base part 12 and the glass plate 21 can be maintained in the compressed state. Because of the contact bonding of the adhesive 15 and the compression of the conductive rubber 16 in a state in which a sufficient adhesion is secured, it is possible to secure conductivity between the feeding part 22 and the base part 12 via the conductive rubber 16.

The contact bonding of the adhesive 15 can be realized by curing the adhesive 15 by the pressing and the heating. The adhesive 15 cures because a crosslinked polymer included in the adhesive 15 cures when heated. In addition, in a case in which the adhesive 15 changes color before and after the contact bonding (for example, changes from black before the curing into gray after the curing), a state of the contact bonding of the adhesive 15 can be visually confirmed from color identification.

In a case in which the pair of (a plurality of) glass plates and the interlayer film are heated and bonded by a method that uses a rubber bag, the contact bonding of the adhesive 15 can be achieved because the terminal 11 can be pressed against the glass plate 21 at the inner surface of the rubber bag. On the other hand, in a case in which the pair of glass plates and the interlayer film are heated and bonded by a method that does not use the rubber bag, the contact bonding of the adhesive 15 can be achieved by using a predetermined means (for example, a clamp member, a fastener, or the like that retains and clamps the terminal 11 and the glass plate 21) to press the terminal 11 against the glass plate 21.

In addition, the softening process of the second step may insert the laminated body formed by the pair of (a plurality of) glass plates and the interlayer film into a rubber bag, and perform a de-airing process while heating, in the pre-pressing process that provisionally adheres the plurality of glass plates. Moreover, the curing process of the second step may subject the provisionally adhered glass plates to a heating process in a compression state, in the autoclave process that permanently adheres the provisionally adhered glass plates.

In the pre-pressing process, the adhesive 15 once softens when heated to a temperature of 70° C. or higher and lower than 120° C. In this state, the terminal 11 can be pressed against the glass plate 21 at the inner surface of the rubber bag, so that the terminal 11 and the glass plate 21 are bonded together. In this state, the adhesive 15 may be compressed to a certain extent, and the thickness of the adhesive may once return due to a reaction force of the conductive rubber as the process makes a transition from the pre-pressing process to the autoclave process.

Next, in the autoclave process, the adhesive 15 is heated to a temperature of 120° C. or higher and compressed. In an initial stage of the autoclave process, the adhesive 15 is in the softened state, and the adhesive 15 can easily be compressed. In addition, by further raising the temperature, the adhesive 15 cures. Hence, the adhesive 15 can be cured in the compressed state. When suitably compressing the adhesive 15 in an autoclave, it is preferable to position the adhesive 15 so as to surround the periphery of the conductive rubber because the pressure can be efficiently applied to the terminal 11.

The method of manufacturing the laminated glass in the method of manufacturing the windshield with the terminal 11 described above is not limited to the above described steps, and may use known methods. For example, a cleaning process to clean the glass plate may be performed when appropriate.

A process to cover the terminal 11 by a protection cover is preferably performed before the second step. For example, when decompressing in the rubber bag in the pre-pressing process of step S15, it is preferable to cover the terminal 11 bonded on the glass plate by the protection cover before the insertion into the rubber bag, in order to insert the glass plate with the terminal 11 covered by the protection cover into the rubber bag. In this case, it is possible to prevent the terminal 11 and the rubber bag from interfering with each other and causing the rubber bag to break. In addition, it is also possible to prevent the terminal 11 from becoming deformed by the pressure of the rubber bag.

The protection cover in the plan view preferably has a structure overlapping the base part 12 at least at two opposing sides of the base part 12 of the terminal 11. In this case, the protection cover is retained by the pressure of the rubber bag, and the protection cover can press against the base part 12 in a state in which a pressure deviation is small. Hence, a pressure difference generated at the base part 12 can be reduced, and the adhesive 15 can be bonded onto the glass plate so that the thickness of the adhesive 15 becomes constant.

Figure 9:
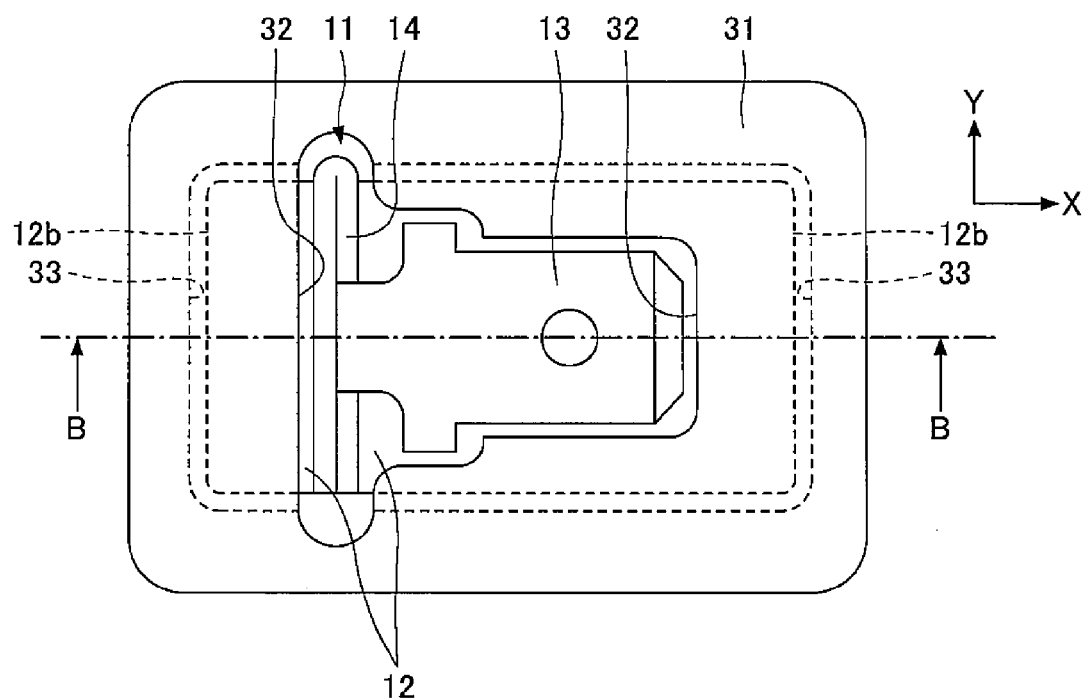
FIG. 9 is a plan view of the terminal covered by a protection cap.
Figure 10:
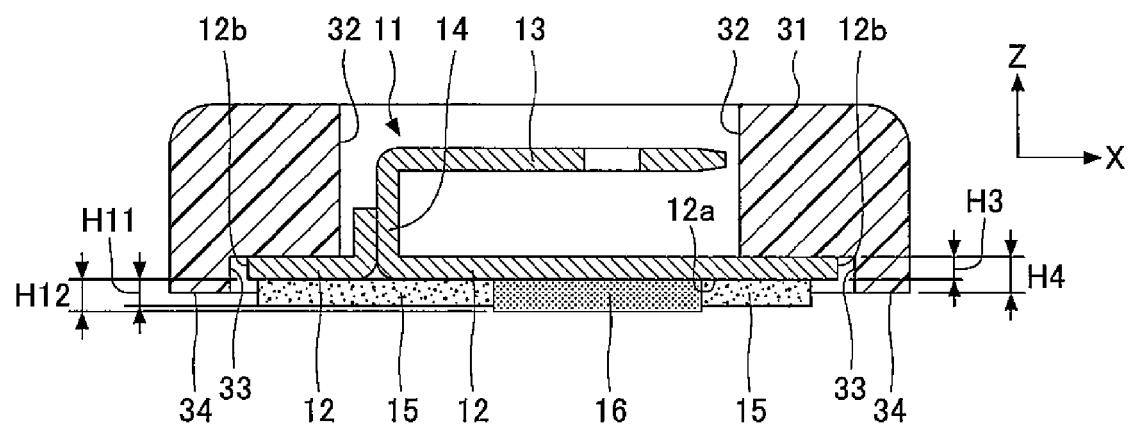
FIG. 10 is a cross sectional view along B-B in FIG. 9.

FIG. 9 is a plan view of the terminal 11 covered by a protection cap 31. FIG. 10 is a cross sectional view along B-B in FIG. 9. The protection cap 31 includes an upper opening 32, and a lower opening 33. The upper opening 32 may be omitted. The protection cap 31 is preferably formed by a material having a hardness that enables deformation of the protection cap 31 to an extent such that the terminal 11 can be supported without damaging the rubber bag, and may be formed by a PPS resin, for example. Although FIGS. 9 and 10 illustrate each of the parts with a gap so that external shapes of the parts are easier to see, however, the male terminal part 13 and the support part 14 are preferably supported in a state sandwiched from the sides by side surfaces defining the opening 32, and the base part 12 is preferably sandwiched from the sides in a state in which an external edge 12b makes contact with side surfaces defining the opening 33.

In addition, when the terminal 11 and the glass plate are compressed within the rubber bag to make the contact bonding, a bottom surface 34 of the protection cap 31 makes contact with the surface of the glass plate. Hence, the adhesive 15 and the conductive rubber 16 can be compressed with a predetermined compressibility to a predetermined thickness with which the sufficient adhesion and conductivity can be obtained. For example, an initial thickness H11 of the adhesive 15 prior to the compression and an initial thickness H12 of the conductive rubber 16 prior to the compression can respectively be compressed to a thickness that is obtained by subtracting a plate thickness H3 of the base part 12 from a height H4 of the opening 33 from the bottom surface 34.

Instead of using the protection cap 31, a dowel (emboss, projection) may be provided on the mounting surface 12a of the base part 12, in order to press the terminal 11 against the glass plate so that the thickness of the adhesive 15 becomes constant.

Moreover, the protection cap 31 may be mounted on the terminal arranged on the glass plate, in the terminal arranging process of step S14 illustrated in FIG. 8, and may be removed after the pre-pressing process of step S15 that uses the rubber bag, or after the autoclave process of step S16.

<Configuration of Terminal 41>

Next, a description will be given of a terminal 41 having a configuration different from that of the terminal 11. In the electrically connecting structure and the method of manufacturing the glass plate with terminal, a description of the configuration and effects that are the same as those of the terminal 11 will be omitted or simplified.

Figure 11:
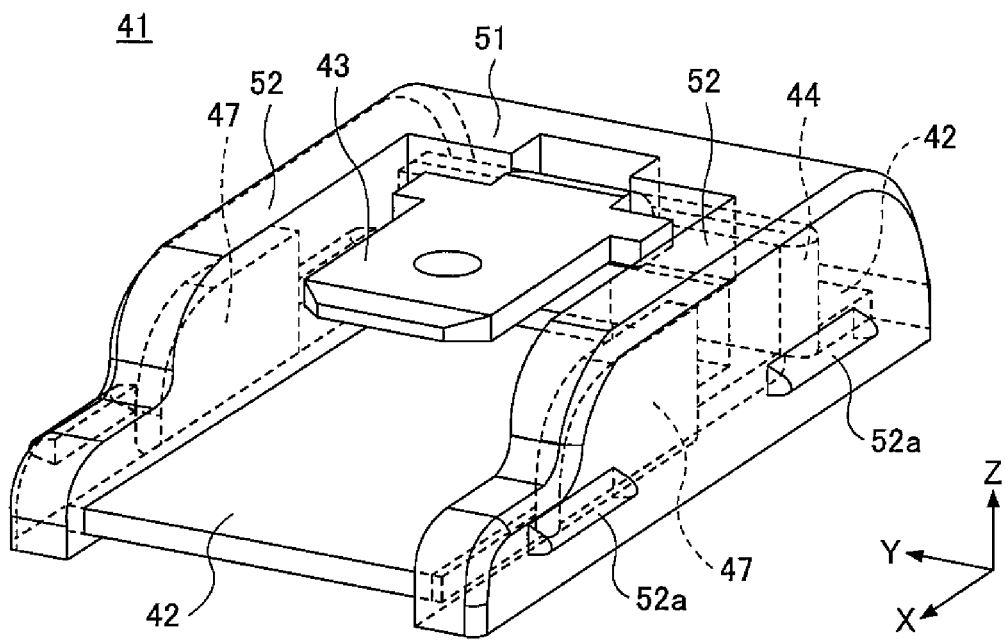
FIG. 11 is a perspective view illustrating an example of the terminal.

FIG. 11 is a perspective view illustrating an example of the terminal 41 in one embodiment of the present invention. The terminal 41 includes a base part 42, a male terminal part 43, a support part 44, and sidewalls 47. The base part 42, the male terminal part 43, the support part 44, and the sidewalls 47 are metal parts having a part covered by mold resin parts 51 and 52. The mold resin part 51 covers a base part of the male terminal part 43 and the support part 44 up to an upper part thereof, and the mold resin part 52 covers the sidewalls 47 extending vertically from side ends of the base part 42 up to upper parts of the sidewalls 47.

Because the metal part of the terminal 41 is covered by the mold resin parts 51 and 52, it is possible to prevent direct contact between the metal part of the terminal 41 and a production facility such as the rubber bag described above or the like. As a result, it is possible to eliminate the processes of mounting and removing the protection cap 31 illustrated in FIGS. 9 and 10 for the purposes of protecting damage or the like to the production facility. For example, as illustrated in FIG. 11, the mold resin parts 51 and 52 preferably include parts having a distance further away from the glass plate or the base part 42 than the male terminal part 43, which is the metal part having a distance furthest away from the glass plate or the base part 42.

Figure 12:
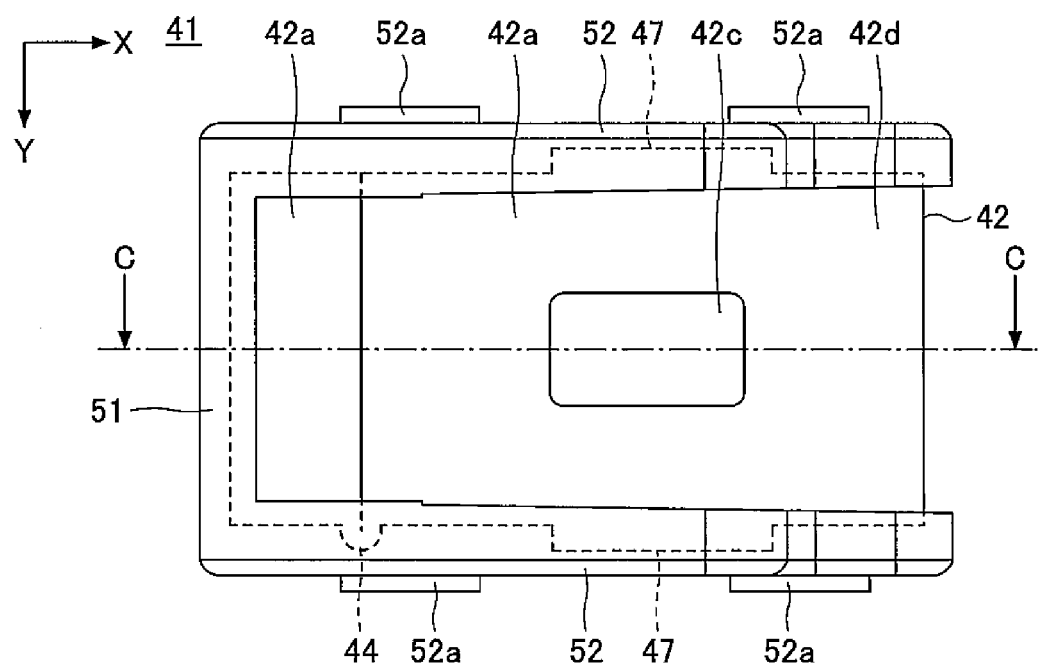
FIG. 12 is a bottom view of the terminal illustrated in FIG. 11.

FIG. 12 is a bottom view of the terminal 41. An elongated rectangular mounting surface 42a that is formed to be planar, is provided as a bonding surface with respect to the glass plate that is not illustrated, at a bottom surface of the plate-shaped base part 42. A non-conductive adhesive 15, and a conductive rubber 16 (illustration thereof omitted in FIG. 12) are mounted on the mounting surface 42a in a planar manner, similarly as in the case of FIG. 2. A bonding surface 42c to bond to the conductive rubber 16 is provided at a central part of the mounting surface 42a, and a bonding surface 42d to bond to the adhesive 15 is provided in a peripheral part of the bonding surface 42c of the mounting surface 42a. The terminal 41 is bonded to the surface of the glass plate in a state in which the adhesive 15 and the conductive rubber 16 are sandwiched between the surface of the glass plate and the mounting surface 42a in a normal direction to the base part 42.

Figure 13:
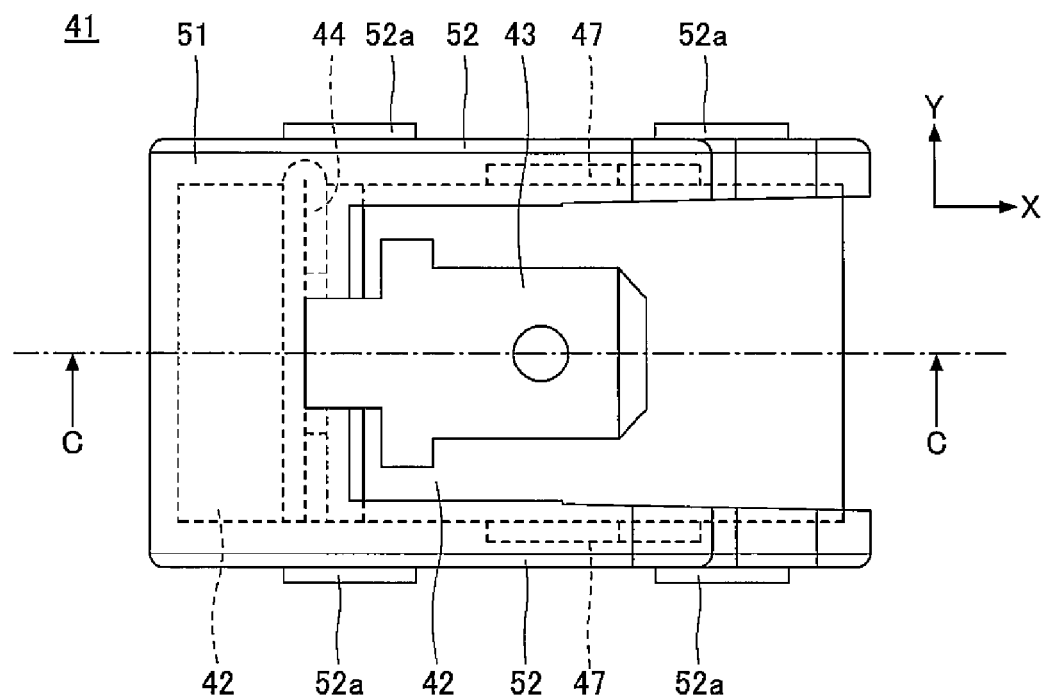
FIG. 13 is a plan view of the terminal illustrated in FIG. 11.
Figure 14:
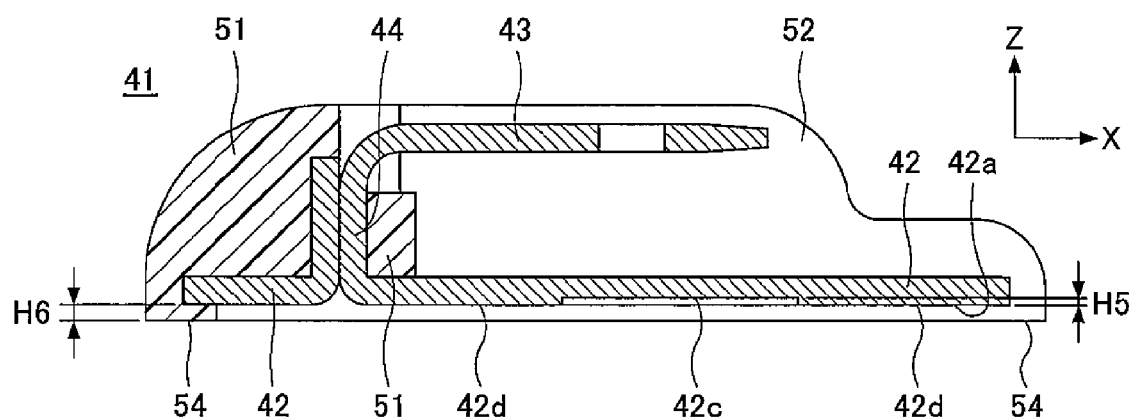
FIG. 14 is a cross sectional view along C-C in FIGS. 12 and 13.

FIG. 13 is a plan view of the terminal 41, and FIG. 14 is a cross sectional view along C-C in FIG. 13. In FIG. 14, the illustration of the conductive rubber and the adhesive is omitted. Similarly as in the case of FIG. 7, the terminal 41 is provided on the surface of the glass plate in a state in which the conductive rubber and the adhesive are sandwiched between the glass plate and the terminal 41.

In addition, when the terminal 41 and the glass plate are compressed within a rubber bag or the like to make close contact with each other, a bottom surface 54 of the mold resin parts 51 and 52 makes contact with the surface of the glass plate, and the adhesive and the conductive rubber provided on the side of the mounting surface 42a can be compressed with a predetermined compressibility to a predetermined thickness with which sufficient adhesion and conductivity are obtained. For example, an initial thickness of the adhesive before the compression and an initial thickness of the conductive rubber before the compression can respectively be compressed to a height H6 of the mounting surface 42a of the base part 42 from the bottom surface 54.

Further, as illustrated in FIG. 14, the bonding surface 42d of the base part 42 to bond to the adhesive, and the bonding surface 42c of the base part 42 to bond to the conductive rubber preferably are respectively located on planes having different distances from the glass plate or the bottom surface 54. In the case illustrated in FIG. 14, the bonding surface 42c is a concave surface with respect to the bonding surface 42d. However, the bonding surface 42c may be a convex surface with respect to the bonding surface 42d. By adjusting a difference H5 at a stepped part between the bonding surface 42d and the bonding surface 42c depending on the types of the conductive rubber and the adhesive, it is possible to suitably select the compressibility and thickness with which the sufficient adhesion and conductivity can be obtained.

In addition, as illustrated in FIGS. 11, 12, and 13, a projecting rib 52a is formed on outer side surfaces of the mold resin part 52. The ribs 52a are fixing parts for fixing a decorated cover that can cover a part of or the entire terminal 41, so that a part or the entire terminal 41 is not visible from the outside. Such fixing parts do not need to have the projecting shape, and may have an arbitrary shape as long as the decorated cover can be fixed thereon. For example, in a case in which the decorated cover to be fixed by the fixing parts of the mold resin part has a convex shape, the fixing parts may have a concave shape.

Figure 15:
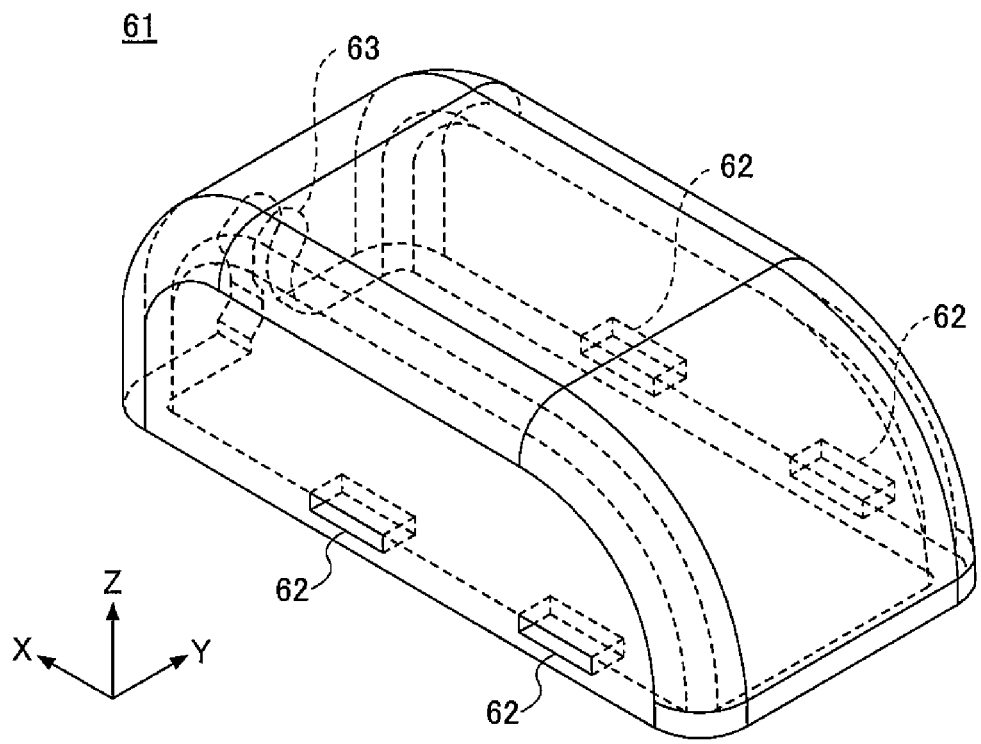
FIG. 15 is a perspective view of a decorative cover.

FIG. 15 is a perspective view of a decorative cover 61 having fixing holes 62 into which the ribs 52a fit. The decorative cover 61 can be mounted on the terminal 41, by fitting the ribs 52a of the mold resin part 52 into the fixing holes 62 of the decorative cover 61.

Figure 16:
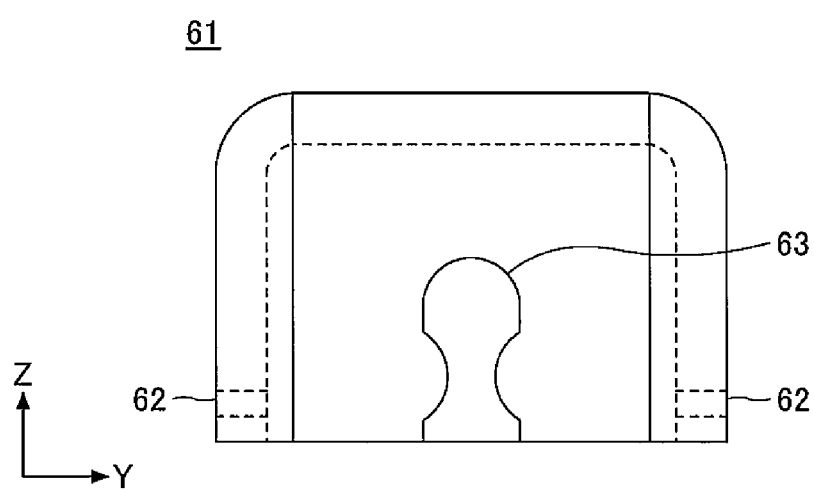
FIG. 16 is a rear view of the decorative cover.

FIG. 16 is a rear view of the decorative cover 61. The decorative cover 61 has a sidewall formed with a penetration hole 63 penetrated by a cable connected to the male terminal part 43 of the terminal 41. Hence, the decorative cover 61 can easily be mounted on the terminal 41, even in a state in which the cable is connected.

The decorative appearance can be improved by employing the decorative cover. In addition, in a case in which an electronic circuit such as an amplifier or the like is connected to the terminal 41, the decorative cover can prevent the electronic circuit from becoming exposed.

Exemplary Implementations

Figure 17:
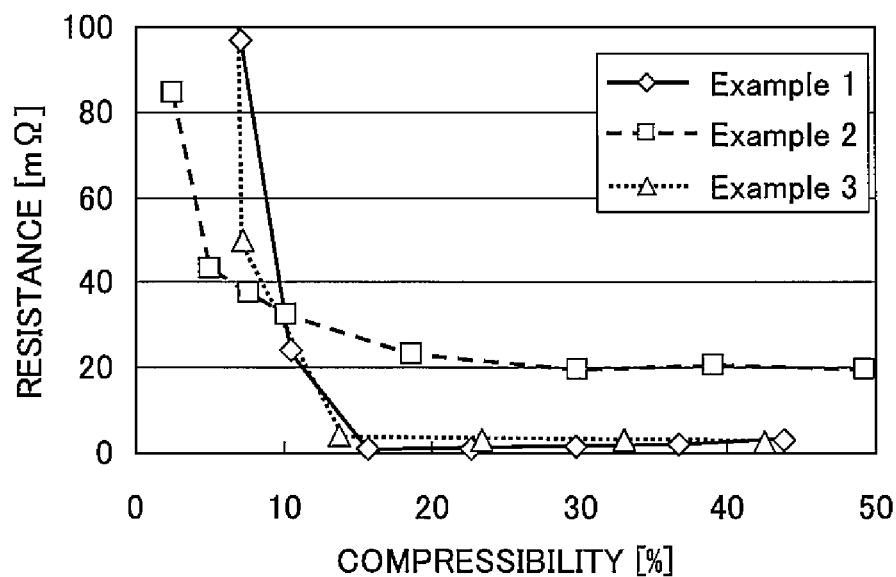
FIG. 17 is a diagram illustrating a relationship between resistance and compressibility of a new conductive rubber.

FIG. 17 is a diagram illustrating a relationship between resistance and compressibility of a new conductive rubber. An example 1 represents a conductive rubber (EC60A) manufactured by Shin-Etsu Chemical Co., Ltd., an example 2 represents a conductive rubber (dot connector PSA45-095) manufactured by POLYMATECH JAPAN CO., LTD., and an example 3 represents a conductive silicone rubber (ZymerE) manufactured by Toho Polymer Co., LTD. As illustrated in FIG. 17, when each of the conductive rubbers is compressed with a compressibility of 10% or higher, the resistance of the conductive rubber can be set to 50 mΩ or less with which a sufficient conductivity can be secured.

Figure 18:
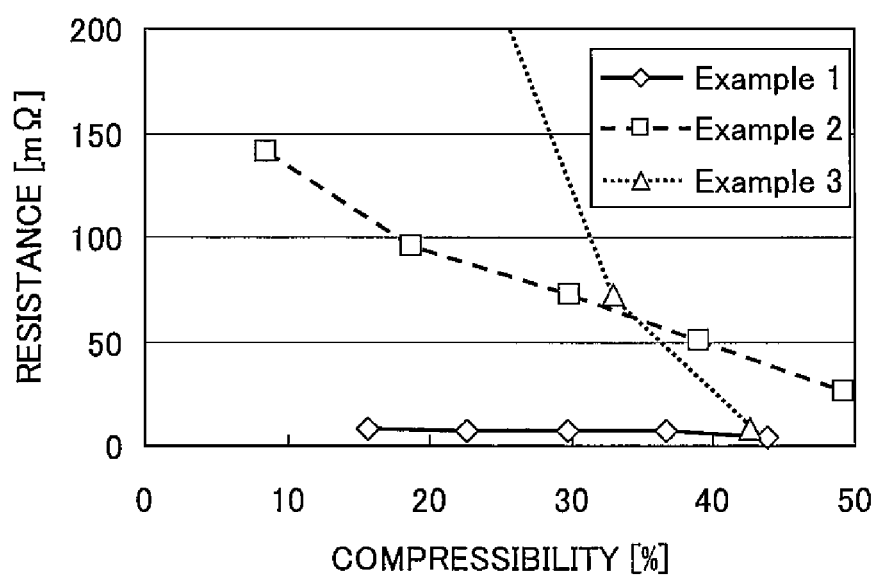
FIG. 18 is a diagram illustrating a relationship between resistance and compressibility of the conductive rubber after a heat shock test.

FIG. 18 is a diagram illustrating a relationship between resistance and compressibility of the conductive rubber after a heat shock test. FIG. 18 illustrates measured data for a case in which a heat shock cycle is set to 560 cycles. Even with the same compressibility as the case illustrated in FIG. 17, the resistance of the conductive rubber increased by the heat shock cycles. Accordingly, when time degradation is taken into consideration, it is preferable from the viewpoint of securing the conductivity of the conductive rubber to compress the conductive rubber with a compressibility of 20% or higher, and it is further preferable from the viewpoint of securing a sufficient conductivity of the conductive rubber to compress the conductive rubber with a compressibility of 30% or higher.

TABLE 1

| | (Units: N) | | | |
|---|---|---|---|---|
| | Z-axis direction | X-axis direction | Y-axis direction | Average |
| Example 4 | 133 | 94 | 97 | 108 |
| Example 5 | 342 | 237 | 571 | 383 |
| Example 6 | 338 | 463 | 407 | 403 |

Table 1 illustrate measured data indicating a relationship between the adhesive 15 and a tensile strength. A tensile test is performed by varying specifications of the adhesive for the glass plate and the terminal amongst three kinds. An example 4 represents a conductive adhesive (ECA-19) manufactured by CEMEDINE Co., Ltd., an example 5 represents a conventional solder including lead, and an example 6 represents an acrylic foam structural bonding tape (#9270), which is an acrylic thermosetting adhesive, manufactured by 3M Japan Limited. In addition, each direction illustrated in Table 1 represents a terminal pulling direction matching each axis direction illustrated in FIGS. 6 and 7.

When the conductive adhesive of the example 4 is used for the adhesive 15 of the electrically connecting structure 1, even in a case in which the entire mounting surface 12a of the base part 12 is regarded as the bonding surface, the tensile strength is weak in all of the pulling directions when compared to the example 5 using the conventional solder for the bonding.

On the other hand, when the thermosetting adhesive of the example 6 is used for the adhesive 15 of the electrically connecting structure 1 and the compression is performed with a compressibility of 25%, an average value of the tensile strength in each pulling direction becomes high compared to the example 5 which uses the conventional solder for the bonding, even if the bonding surface of the mounting surface 12a only exists in a part excluding the conductive rubber 16.

The electrical connecting structure and the method of manufacturing the glass plate with terminal are described above with reference to embodiments and exemplary implementations, however, the present invention is not limited to the embodiments and exemplary implementations. Various variations and modifications may be made by combining or replacing a part of all of the embodiments or exemplary implementation with other embodiments or exemplary implementations, within the scope of the present invention.

For example, the terminal may be a connector terminal having a plurality of base parts, so that the terminal may be provided spanning a plurality of feeding parts. In this case, one base part that electrically connects to an inner conductor of a coaxial cable connected to the connector terminal may be provided on the feeding part that electrically connects to an antenna element, and another base part that electrically connects to an outer conductor of the coaxial cable may be provided on a ground-side feeding part that electrically connects to the ground such as the vehicle or the like. The terminal may be a connector terminal provided with a signal processing circuit that includes an amplifier or the like. According to this configuration, the connector terminal can amplify a reception signal, so that the reception signal from the antenna element will not be excessively attenuated while being transmitted via the coaxial cable to a communication apparatus side, for example. The communication apparatus (for example, a receiver or a transmitter and receiver) that is provided in the vehicle is connected to the other end on the opposite side from the terminal of the coaxial cable.

The terminal is not limited to that including a terminal part configured as prescribed by JIS, and may include a terminal part having other arbitrary configurations. In addition, the configuration of the terminal part is not limited to the male type, and may be a female type.

The terminal is not limited to that for use in connecting the feeding part of the glass plate and the cable, and may be for use in connecting the feeding part of the glass plate and another conductor part (for example, a grounding member electrically connecting to the feeding part of the glass plate and the vehicle).

On the mounting surface of the base part of the terminal, the positions where the conductive rubber and the adhesive are arranged may be interchanged within a range that does not deteriorate the effects of the present invention.

The glass plate is not limited to the front glass of the vehicle, and may be any of a rear glass, a side glass, and a roof glass. Further, the glass plate is not limited to that for the vehicle, and may be for a building material.

According to the embodiments and exemplary implementations, sufficient adhesion and conductivity can be obtained without using solder.

What is claimed is:
1. An electrically connecting structure comprising:
a glass plate;
a feeding part formed on the glass plate;
a terminal having a base part opposing the glass plate;
an adhesive adhering the glass plate and the terminal; and
a conductive rubber arranged between the feeding part and the base part,
wherein the adhesive is a thermosetting adhesive that once softens when heated and thereafter cures, and is positioned at least on both sides of the conductive rubber, and
wherein the feeding part and the base part have electrical continuity via the conductive rubber.

2. The electrically connecting structure as claimed in claim 1, wherein the adhesive is positioned to surround a periphery of the conductive rubber.

3. The electrically connecting structure as claimed in claim 1, wherein the adhesive is compressed and cured in a state before the glass plate and the terminal are bonded, so that the conductive rubber is maintained in a compressed state.

4. The electrically connecting structure as claimed in claim 1, wherein the adhesive heated from a state before bonding the glass plate and the terminal has properties such that a viscosity of the adhesive is $6.0 \times 10^3$ Pa·s or less at a temperature of 70° C. or higher and lower than 120° C., and cures at a temperature of 120° C. or higher.

5. The electrically connecting structure as claimed in claim 1, wherein the conductive rubber has a resistance that varies depending on a compressibility thereof, and is maintained in a state compressed with a compressibility of 10% or higher from an initial thickness before compression.

6. The electrically connecting structure as claimed in claim 1, wherein the conductive rubber has a resistance that varies depending on a compressibility thereof, and is maintained in a state compressed until the resistance becomes 100 mΩ or lower.

7. The electrically connecting structure as claimed in claim 1, wherein a bonding surface between the base part and the adhesive, and a bonding surface between the base part and the conductive rubber, are respectively located on planes having different distances from the glass plate.

8. The electrically connecting structure as claimed in claim 1, wherein the terminal includes a metal part, and a mold resin part that covers at least a part of the metal part, and the mold resin part includes a part having a distance further away from the glass plate than the metal part.

9. The electrically connecting structure as claimed in claim 8, wherein the terminal is covered by a cover fixed to the mold resin part.

10. A method of manufacturing a glass plate with a terminal, comprising:
a first step to position a conductive rubber between a feeding part of the glass plate and a base part of the terminal; and
a second step to hold the conductive rubber in a compressed state, and to heat and cure an adhesive that bonds the glass plate and the terminal in a state in which the adhesive is compressed by applying pressure thereon, so that electrical continuity is secured between the feeding part and the base part via the conductive rubber.

11. The method manufacturing the glass plate with the terminal as claimed in claim 10, wherein
the adhesive is a thermosetting adhesive that once softens when heated and thereafter cures, and
the second step includes a softening process that once softens the adhesive by heating, and a curing process that cures the adhesive in the compressed state by heating.

12. The method manufacturing the glass plate with the terminal as claimed in claim 10, wherein
the glass plate is a laminated glass including a plurality of glass plates laminated via interlayer films, and
the first step is performed before a heating and bonding process that heats and bonds the plurality of glass plates and the interlayer films, and the second step is performed in the heating and bonding process.

13. The method manufacturing the glass plate with the terminal as claimed in claim 11, wherein
the glass plate is a laminated glass including a plurality of glass plates laminated via interlayer films, and
the softening process performs a de-airing process while heating a laminated body, formed by the plurality of of glass plates and the interlayer films, and inserted into a rubber bag, in a pre-pressing process that provisionally adheres the plurality of glass plates, and the curing process performs a heating process to heat the plurality of provisionally adhered glass plates in a compressed state, in an autoclave process that permanently adheres the plurality of provisionally adhered glass plates.

14. The method manufacturing the glass plate with the terminal as claimed in claim 10, wherein a process to cover the terminal by a protection cover is performed before the second step.

* * * * *